United States Patent
Morimura et al.

(10) Patent No.: US 10,461,225 B2
(45) Date of Patent: Oct. 29, 2019

(54) METHOD OF MANUFACTURING LIGHT-EMITTING DEVICE INCLUDING SEALING MATERIALS WITH PHOSPHOR PARTICLES

(71) Applicant: TOYODA GOSEI CO., LTD., Kiyosu-shi (JP)

(72) Inventors: Yuta Morimura, Kiyosu (JP); Yuhki Ito, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/054,040

(22) Filed: Feb. 25, 2016

(65) Prior Publication Data
US 2016/0268485 A1 Sep. 15, 2016

(30) Foreign Application Priority Data
Mar. 9, 2015 (JP) .................... 2015-045876

(51) Int. Cl.
*H01L 33/50* (2010.01)
*H05B 33/10* (2006.01)
*H05B 33/04* (2006.01)

(52) U.S. Cl.
CPC .......... *H01L 33/504* (2013.01); *H01L 33/508* (2013.01); *H01L 33/501* (2013.01);
(Continued)

(58) Field of Classification Search
CPC ................... H01L 33/504; H01L 33/54; H01L 2933/0041; H01L 2933/005;
(Continued)

(56) References Cited

U.S. PATENT DOCUMENTS 7,808,007 B2 * 10/2010 Otsuka .................. H01L 33/505
257/80
7,808,012 B2 * 10/2010 Masuda .................. C04B 35/22
257/88

(Continued)

FOREIGN PATENT DOCUMENTS

JP 2006-135300 A 5/2006
JP 2007-049114 A 2/2007
(Continued)

OTHER PUBLICATIONS

Japanese Office Action, dated Feb. 6, 2018, in Japanese Application No. 2015-045876 and English Translation thereof.

*Primary Examiner* — Mohsen Ahmadi
*Assistant Examiner* — Scott E Bauman
(74) *Attorney, Agent, or Firm* — McGinn I.P. Law Group, PLLC.

(57) ABSTRACT

A method of manufacturing a light-emitting device includes providing a case including a recessed portion and mounting a light-emitting element on a bottom of the recessed portion, putting a first sealing material including a first phosphor particle into the recessed portion, putting a second sealing material including a second phosphor particle on the first sealing material in the recessed portion, and precipitating the second phosphor particle before the second sealing material cures. The second phosphor particle is located above the first phosphor particle after the first and second sealing materials cure.

18 Claims, 6 Drawing Sheets

(52) U.S. Cl.
CPC .............. *H01L 2224/48091* (2013.01); *H01L 2924/181* (2013.01); *H01L 2933/0041* (2013.01); *H05B 33/04* (2013.01); *H05B 33/10* (2013.01)

(58) Field of Classification Search
CPC ....... H01L 2924/00; H01L 2924/00014; H01L 33/508; H01L 33/501; H01L 2224/48091; H01L 2924/181; H05B 33/04; H05B 33/10
USPC .............................................. 438/27; 257/98
See application file for complete search history.

(56) References Cited

U.S. PATENT DOCUMENTS

| | | | | |
|---|---|---|---|---|
| 8,004,002 B2* | 8/2011 | Okazaki | ............... | H01L 33/504 257/100 |
| 8,058,088 B2* | 11/2011 | Cannon | ................ | H01L 33/507 257/E33.061 |
| 8,288,936 B2* | 10/2012 | Ohta | ...................... | C09K 11/02 313/503 |
| 8,441,179 B2* | 5/2013 | Pickard | ................ | H01L 33/504 313/485 |
| 8,502,441 B2* | 8/2013 | Izumi | .................... | H01L 33/504 313/498 |
| 8,513,872 B2* | 8/2013 | Annen | ................... | B82Y 30/00 313/483 |
| 8,663,498 B2* | 3/2014 | Masuda | ................ | B82Y 30/00 252/301.4 F |
| 8,729,788 B2* | 5/2014 | Masuda | ................ | C09K 11/0883 313/487 |
| 8,742,654 B2* | 6/2014 | Cabalu | ..................... | H01J 1/63 257/100 |
| 9,202,999 B2* | 12/2015 | Kawano | ............... | H01L 33/486 |
| 9,234,132 B2* | 1/2016 | Baumann | ............. | C04B 35/581 |
| 9,240,530 B2* | 1/2016 | Reiherzer | ............ | H01L 33/507 |
| 9,343,441 B2* | 5/2016 | Reiherzer | ........... | H01L 25/0753 |
| 2003/0080341 A1* | 5/2003 | Sakano | .................. | B29C 67/08 257/79 |
| 2004/0120155 A1* | 6/2004 | Suenaga | ................ | H01L 24/49 362/362 |
| 2005/0200271 A1* | 9/2005 | Juestel | ............... | C09K 11/7718 313/503 |
| 2006/0073625 A1 | 4/2006 | Harada | | |
| 2006/0076569 A1* | 4/2006 | Otsuka | ............... | C09K 11/7734 257/98 |
| 2006/0226759 A1 | 10/2006 | Masuda et al. | | |
| 2007/0029565 A1* | 2/2007 | Masuda | ............. | C09K 11/0883 257/98 |
| 2007/0052342 A1* | 3/2007 | Masuda | ............. | C09K 11/0883 313/487 |
| 2008/0054279 A1 | 3/2008 | Hussell et al. | | |
| 2008/0213928 A1 | 9/2008 | Harada | | |
| 2008/0231170 A1* | 9/2008 | Masato | ................ | C09K 11/565 313/501 |
| 2010/0013373 A1* | 1/2010 | Hata | ..................... | H01L 33/504 313/502 |
| 2010/0084629 A1* | 4/2010 | Park | ....................... | B82Y 20/00 257/13 |
| 2010/0213821 A1 | 8/2010 | Masuda et al. | | |
| 2010/0237370 A1 | 9/2010 | Kim et al. | | |
| 2011/0204400 A1 | 8/2011 | Koizumi et al. | | |
| 2012/0248479 A1* | 10/2012 | Anc | ........................ | H01L 33/504 257/98 |
| 2013/0062649 A1* | 3/2013 | Hata | ..................... | H01L 33/501 257/98 |
| 2013/0207130 A1* | 8/2013 | Reiherzer | ........... | H01L 25/0753 257/88 |
| 2014/0225145 A1 | 8/2014 | Masuda et al. | | |
| 2015/0014725 A1* | 1/2015 | Hong | .................. | C09K 11/7721 257/98 |
| 2015/0162509 A1* | 6/2015 | Kuramoto | .......... | H01L 33/50 257/98 |
| 2016/0081142 A1* | 3/2016 | Abe | ....................... | H05B 33/04 313/512 |

FOREIGN PATENT DOCUMENTS

| | | |
|---|---|---|
| JP | 2008-103688 A | 5/2008 |
| JP | 2010-538453 A | 12/2010 |
| JP | 2011-171557 A | 9/2011 |
| JP | 2016-058614 A | 4/2016 |

\* cited by examiner

METHOD OF MANUFACTURING LIGHT-EMITTING DEVICE INCLUDING SEALING MATERIALS WITH PHOSPHOR PARTICLES

The present application is based on Japanese patent application No. 2015-045876 filed on Mar. 9, 2015, the entire contents of which are incorporated herein by reference.

BACKGROUND OF THE INVENTION

1. Field of the Invention

The invention relates to a method of manufacturing a light-emitting device.

2. Description of the Related Art

A light-emitting device is known in which plural types of phosphors are each located in different layers in a sealing resin (see e.g. JP-A-2007-49114).

Also, a method of manufacturing a light-emitting device is known in which a sealing resin is heated so as to decrease the viscosity of the sealing resin to precipitate phosphor particles included in the sealing resin (see e.g. JP-A-2008-103688).

SUMMARY OF THE INVENTION

If the method of decreasing the viscosity of the sealing resin by heating is used for precipitating the plural types of phosphor particles in the sealing resin, uneven precipitation may occur since the degree of precipitation is different in each type of phosphor particle, resulting in unevenness in emission color of the light-emitting device.

It is an object of the invention to provide a light-emitting device that unevenness in emission color is reduced by precipitating the plural types of phosphor particles at predetermined positions in the sealing material so as not to have the uneven precipitation.

(1) According to an embodiment of the invention, a method of manufacturing a light-emitting device comprises:
  providing a case comprising a recessed portion and mounting a light-emitting element on a bottom of the recessed portion;
  putting a first sealing material comprising a first phosphor particle into the recessed portion;
  putting a second sealing material comprising a second phosphor particle on the first sealing material in the recessed portion; and
  precipitating the second phosphor particle before the second sealing material cures,
  wherein the second phosphor particle is located above the first phosphor particle after the first and second sealing materials cure.

In the above embodiment (1) of the invention, the following modifications and changes can be made
  (i) The second sealing material is put after the first sealing material cures.
  (ii) The second sealing material is put before the first sealing material cures.
  (iii) The first sealing material comprises a dispersant that improves dispersibility of the first phosphor particle.
  (iv) The first sealing material has a lower refractive index than a top layer of the light-emitting element, and wherein the second sealing material has a lower refractive index than the first sealing material,
  (v) The first phosphor particle has a longer fluorescence wavelength than the second phosphor particle.

Effects of the Invention

According to an embodiment of the invention, a light-emitting device can be provided that unevenness in emission color is reduced by precipitating the plural types of phosphor particles at predetermined positions in the sealing material so as not to have the uneven precipitation.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

First Embodiment

Configuration of Light-Emitting Device

Figure 1:
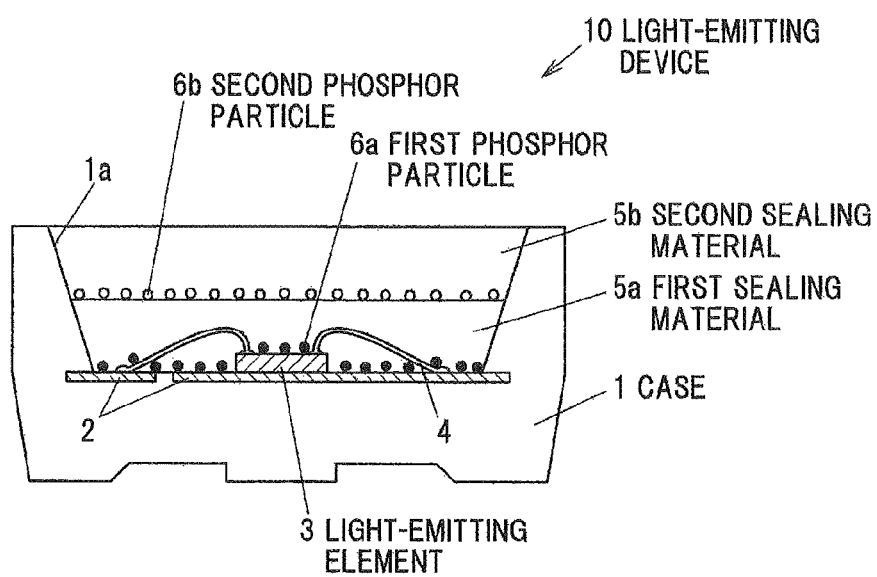
FIG. 1 is a vertical cross sectional view showing a light-emitting device in a first embodiment.

FIG. 1 is a perspective view showing a light-emitting device 10 in the first embodiment. The light-emitting device 10 has a case 1 having a recessed portion 1a, a base 2 housed in the case 1 so that an upper surface is exposed on the bottom of the recessed portion 1a, a light-emitting element 3 mounted on the base 2, a first sealing material 5a and a second sealing material 5b filled in the recessed portion 1a to seal the light-emitting element 3, and first phosphor particles 6a and second phosphor particles 6b respectively included in the first sealing material 5a and the second sealing material 5b.

The case 1 is formed of, e.g., a thermoplastic resin such as polyphthalamide resin, LCP (liquid crystal polymer) or PCT (polycyclohexylene dimethylene terephalate), or a thermosetting resin such as silicone resin, modified silicone resin, epoxy resin or modified epoxy resin. The case 1 may include light-reflecting particles of titanium dioxide, etc., to improve light reflectance.

The entire base 2 or the surface thereof is formed of a conductive material such as Ag, Cu or Al. The base 2 is e.g a lead frame integrally formed with the case 1 by insert molding etc.

The light-emitting element 3 is, e.g., an LED or a laser diode, etc., which has a chip substrate and a crystal layer including cladding layers and an emitting layer sandwiched therebetween. In the example shown in FIG. 1, the light-emitting element 3 is a face-up type element which is connected to the base 2 via bonding wires 4, However, the light-emitting element 3 may be a face-down type element with the crystal layer facing downward, or may be connected to the base 2 via a member other than bonding wires, e.g., via conductive bumps.

The first sealing material 5a is formed on the lower portion in the recessed portion 1a and directly seals the light-emitting element 3. The second sealing material 5b is stacked on the first sealing material 5a. Therefore, the second phosphor particles 6b in the second sealing material 5b are located above the first phosphor particles 6a in the first sealing material 5a.

The first sealing material 5a and the second sealing material 5b are formed of a transparent resin such as silicone-based resin or epoxy-based resin, and specifically, are formed of, e.g., a methyl silicone, a phenyl silicone or an organically modified silicone.

Preferably, the first sealing material 5a has a lower refractive index than a superficial layer of the light-emitting element 3 and the second sealing material 5b has a lower refractive index than the first sealing material 5a. This reduces a refractive index difference between the second sealing material 5b and the ambient air and it is thus possible to improve light extraction efficiency.

In the light-emitting device 10, the first phosphor particles 6a precipitate close to the bottom of the first sealing material 5a and the second phosphor particles 6b precipitate close to the bottom of the second sealing material 5b. This prevents uneven distribution of the first phosphor particles 6a and the second phosphor particles 6b and thus allows the light-emitting device 10 with less color unevenness to be manufactured.

Each of the first phosphor particle 6a and the second phosphor particle 6b has a particle-size distribution. Particles having a relatively large size are likely to precipitate, and particles having a relatively small size are less likely to precipitate. In the first embodiment, at least relatively large particles (particles having a particle size of at least more than D50, preferably not less than D90) of the first phosphor particles 6a and at least those of the second phosphor particles 6b precipitate respectively close to the bottoms of the first sealing material 5a and the second sealing material 5b. D50 and D90 here mean particle diameters at 50% and 90% counted from a small diameter side in the cumulative particle-size distribution. The first phosphor particles 6a and the second phosphor particles 6b in FIG. 1 are schematically shown as the precipitated particles.

Materials of the first phosphor particle 6a and the second phosphor particle 6b are not specifically limited and the following materials can be used. As a blue phosphor, it is possible to use aluminate phosphors such as $BaMgAl_{10}O_{17}$:$Eu^{2+}$. As a green-orange phosphor, it is possible to use, e.g., garnet phosphors such as $(Y, Tb, Lu)_3Al_5O_{12}$:$Ce^{3+}$, orthosilicate phosphors such as $(Ba,Sr)_2SiO_4$:$Eu^{2+}$ or $(Ba,Sr)_3SiO_5$:$Eu^{2+}$, or oxynitride phosphors such as $Ca(Si, Al)_{12}(O,N)_{16}$:$Eu^2$ or $SrSi_2O_2N_2$:$Eu^2$. As a red phosphor, it is possible to use nitride phosphors such as $(Ca,Sr)AlSiN_3$:$Eu^{2+}$ or fluoride phosphors such as $K_2SiF_6$:$Mn^{4+}$.

The first phosphor particle 6a and the second phosphor particle 6b are different types of phosphor particles and are different in material or size, or in both. Therefore, if the first phosphor particles 6a and the second phosphor particles 6b are mixed in the same sealing material and precipitate, a difference in the degree of precipitation between the first phosphor particle 6a and the second phosphor particle 6b causes uneven precipitation. In the light-emitting device 10, since the first phosphor particles 6a and the second phosphor particles 6b precipitate in different layers, unevenness in emission color due to the difference in the degree of precipitation does not occur.

Meanwhile, the first phosphor particle 6a preferably has a longer fluorescence wavelength than the second phosphor particle 6b. This prevents the second phosphor particles 6b from absorbing fluorescence emitted by the first phosphor particles 6a located therebelow, and it is thus possible to obtain the light-emitting device 10 emitting light with a desired color.

Method of Manufacturing the Light-Emitting Device

FIGS. 2A to 2D are vertical cross sectional views showing an example of a process for manufacturing the light-emitting device 10 in the first embodiment.

Figure 2A:
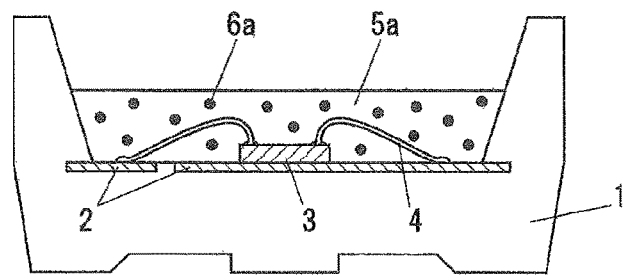
FIGS. 2A to 2D are vertical cross sectional views showing an example of a process for manufacturing the light-emitting device in the first embodiment.

Firstly, as shown in FIG. 2A, the case 1 mounting the light-emitting element 3 on the bottom of the recessed portion 1a is prepared, and the first sealing material 5a including the first phosphor particles 6a is injected into the recessed portion 1a by a dropping method, etc.

Figure 2B:
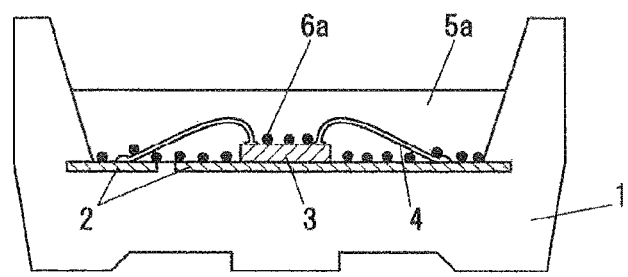

Next, as shown in FIG. 2B, the first sealing material 5a is heated to a temperature at which viscosity is reduced but curing does not rapidly progress (hereinafter, referred to as "viscosity reduction temperature") to cause the first phosphor particles 6a to precipitate close to the bottom of the first sealing material 5a. Here, the viscosity reduction temperature when using, e.g., a silicone-based resin to form the first sealing material 5a is about 70° C.

After the first phosphor particles 6a precipitate and the upper portion of the first sealing material 5a becomes transparent, the first sealing material 5a is cured by further heating to a temperature at which curing progresses relatively rapidly (hereinafter, referred to as "curing temperature"). The curing temperature here is higher than the viscosity reduction temperature and is, e.g., about 140 to 150° C. when the first sealing material 5a is formed of a silicone-based resin.

Figure 2C:
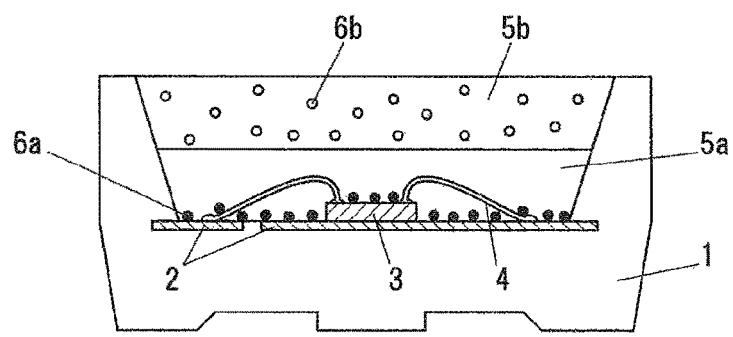

Next, as shown in FIG. 2C, the second sealing material 5b including the second phosphor particles 6b is injected onto the first sealing material 5a in the recessed portion 1a by a dropping method, etc.

Figure 2D:
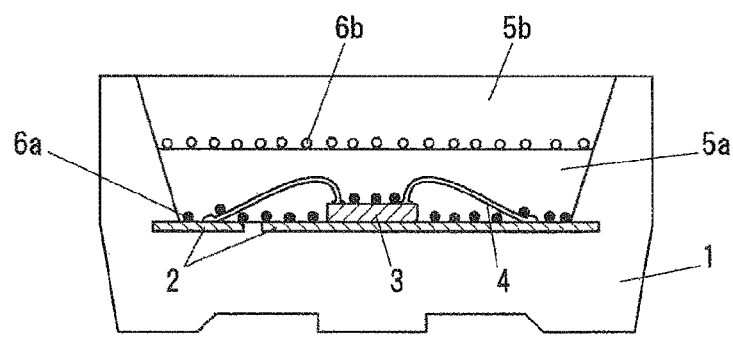

Next, as shown in FIG. 2D, the second sealing material 5b is heated to the viscosity reduction temperature to cause the second phosphor particles 6b to precipitate close to the bottom of the second sealing material 5b.

After the second phosphor particles 6b precipitate and the upper portion of the second sealing material 5b becomes transparent, the second sealing material 5b is cured by further heating to the curing temperature.

Second Embodiment

Configuration of Light-Emitting Device

Figure 3:
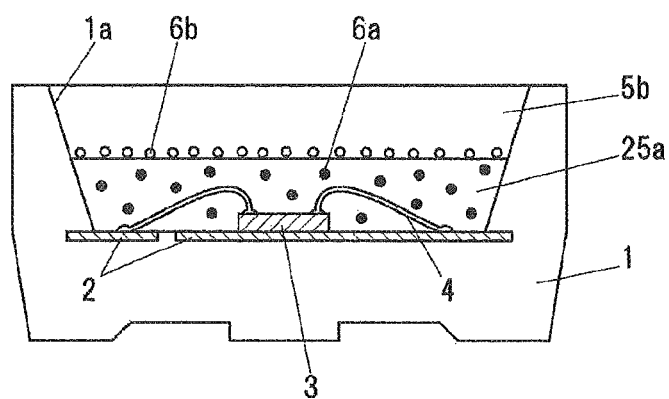
FIG. 3 is a vertical cross sectional view showing a light-emitting device in a second embodiment.

FIG. 3 is a vertical cross sectional view showing a light-emitting device in the second embodiment. The light-emitting device is different from the light-emitting device 10 of the first embodiment mainly in that a first sealing material 25a including a dispersant is provided and the first phosphor particles 6a in the first sealing material 25a hardly precipitate. Note that, the explanation of the same features as the light-emitting device 10 in the first embodiment will be omitted or simplified.

The first sealing material 25a includes a dispersant for improving dispersibility of the first phosphor particles 6a The dispersant is, e.g., particles of silica such as AEROSIL™.

The base material of the first sealing material 25a can be the same material as the first sealing material 5a in the first embodiment but is particularly preferably an organically modified silicone. Since the viscosity of the organically modified silicone is low, the first sealing material 25a can be easily controlled in viscosity by adjusting the amount of the dispersant added. Thereby, the positioning (speed) of the first phosphor particles 6a in the first sealing material 25a can be easily controlled.

In the light-emitting device 20, the first phosphor particles 6a are dispersed in the first sealing material 25a, while relatively large particles (particles having a particle size of at least more than D50, preferably not less than D90) of the second phosphor particles 6b precipitate close to the bottom of the second sealing material 5b.

Method of Manufacturing the Light-Emitting Device

Figure 4A:
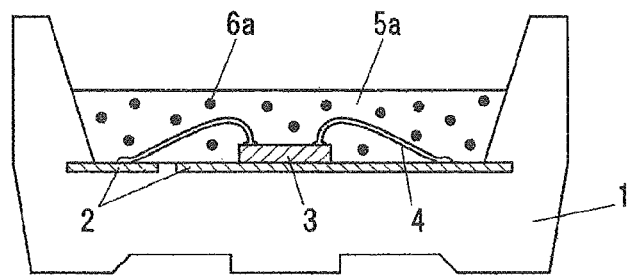
FIGS. 4A to 4C are vertical cross sectional views showing an example of a process for manufacturing the light-emitting device in the second embodiment.
Figure 4B:
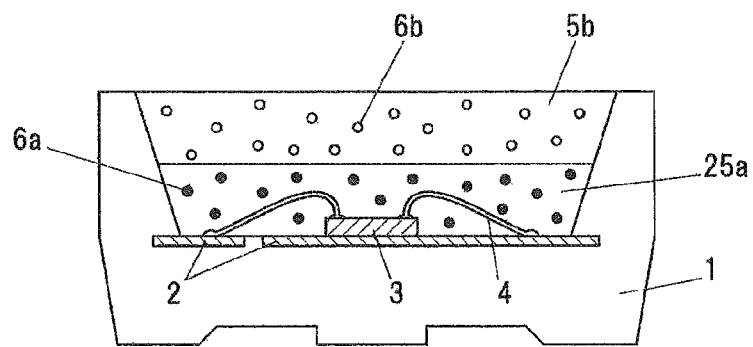
Figure 4C:
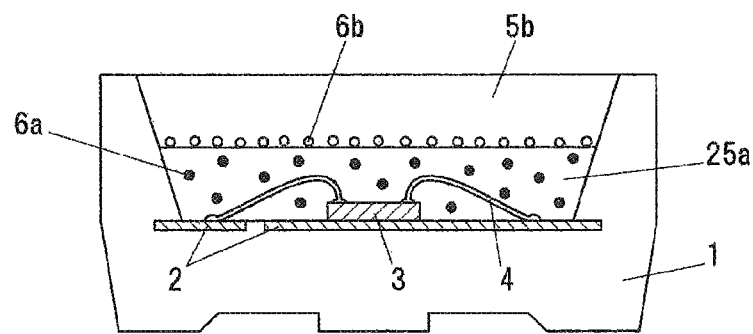

FIGS. 4A to 4C are vertical cross sectional views showing an example of a process for manufacturing the light-emitting device in the second embodiment.

Firstly, as shown in FIG. 4A, the case 1 mounting the light-emitting element 3 on the bottom of the recessed portion 1a is prepared, and the first sealing material 25a including the first phosphor particles 6a is injected into the recessed portion 1a by a dropping method, etc.

At this time, the first phosphor particles 6a hardly precipitate since the dispersant is included in the first sealing material 25a. Although the first sealing material 25a may be cured by heating at this stage, not curing allows the first sealing material 25a to have higher adhesion to the second sealing material 5b to be formed in the next step and the second sealing material 5b is thus less likely to separate from the first sealing material 25a after curing.

Next, as shown in FIG. 4B, the second sealing material 5b including the second phosphor particles 6b is injected onto the first sealing material 25a in the recessed portion 1a by a dropping method, etc.

Next, as shown in FIG. 4C, the second sealing material 5b is heated to the viscosity reduction temperature to cause the second phosphor particles 6b to precipitate close to the bottom of the second sealing material 5b.

At this stage, even when the first sealing material 25a is not cures, the precipitated second phosphor particles 6b do not fall through the first sealing material 25a due to the dispersant included in the first sealing material 25a.

After the second phosphor particles 6b precipitate and the upper portion of the second sealing material 5b becomes transparent, the second sealing material 5b is cured by further heating to the curing temperature. In case that the first sealing material 25a is not cured before injecting the second sealing material 5b, the first sealing material 25a is cured simultaneously with the second sealing material 5b.

Third Embodiment

Configuration of Light-Emitting Device

Figure 5:
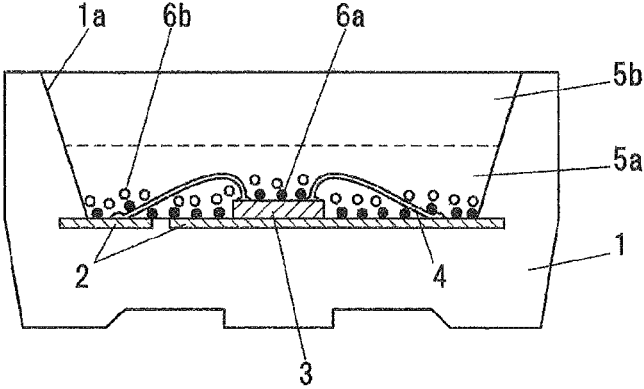
FIG. 5 is a vertical cross sectional view showing a light-emitting device in a third embodiment.
Figure 5:
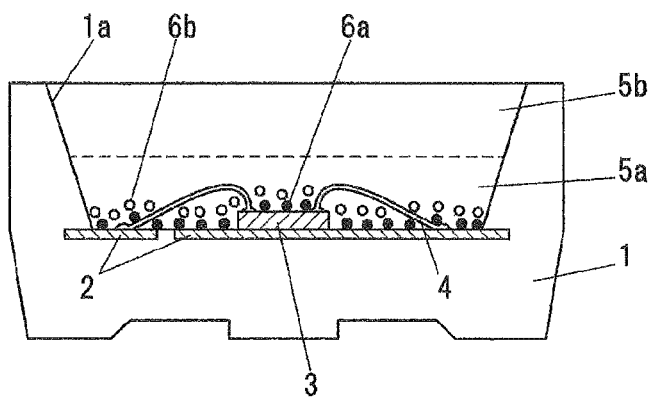

FIG. 5 is a vertical cross sectional view showing a light-emitting device 30 in the third embodiment. The light-emitting device 30 is different from the light-emitting device 10 of the first embodiment mainly in that at least some of the second phosphor particles 6b precipitate in the first sealing material 5a. Note that, the explanation of the same features as the light-emitting device 10 in the first embodiment will be omitted or simplified.

In the light-emitting device 30, relatively large particles (particles having a particle size of at least more than D50, preferably not less than D90) of the first phosphor particles 6a precipitate close to the bottom of the first sealing material 5a, and at least some of relatively large particles (particles having a particle size of at least more than D50, preferably not less than D90) of the second phosphor particles 6b precipitate in the first sealing material 5a.

FIG. 5 shows a state in which all of the relatively large particles of the second phosphor particles 6b precipitate on the first phosphor particles 6a in the first sealing material 5a. Depending on how to cause the second phosphor particles 6b to precipitate or the thickness of the first sealing material 5a, the second phosphor particles 6b may be distributed both in the second sealing material 5b close to the bottom and in the first sealing material 5a.

Method of Manufacturing the Light-Emitting Device

FIGS. 6A to 6D are vertical cross sectional views showing an example of a process for manufacturing the light-emitting device 30 in the third embodiment.

Figure 6A:
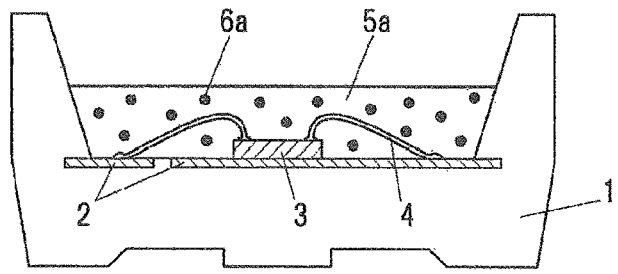
FIGS. 6A to 6D are vertical cross sectional views showing an example of a process for manufacturing the light-emitting device in the third embodiment.

Firstly, as shown in FIG. 6A, the case 1 mounting the light-emitting element 3 on the bottom of the recessed portion 1a is prepared, and the first sealing material 5a including the first phosphor particles 6a is injected into the recessed portion 1a by a dropping method, etc.

Figure 6B:
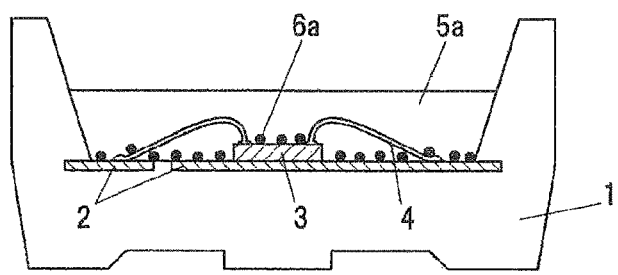

Next, as shown in FIG. 6B, the first sealing material 5a is heated to the viscosity reduction temperature to cause the first phosphor particles 6a to precipitate close to the bottom of the first sealing material 5a.

In the third embodiment, the first sealing material 5a is not cured even after the first phosphor particles 6a precipitate and the upper portion of the first sealing material 5a becomes transparent, and the process proceeds to the next step of injecting the second sealing material 5b. Therefore, the first sealing material 5a and the second sealing material 5b are mixed in the vicinity of an interface therebetween and this prevents the second sealing material 5b from separating from the first sealing material 5a after curing.

Figure 6C:
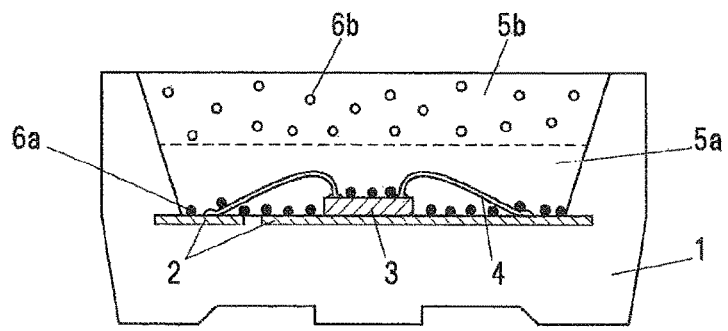

Next, as shown in FIG. 6C, the second sealing material 5b including the second phosphor particles 6b is injected onto the first sealing material 5a in the recessed portion 1a by a dropping method, etc.

Figure 6D:
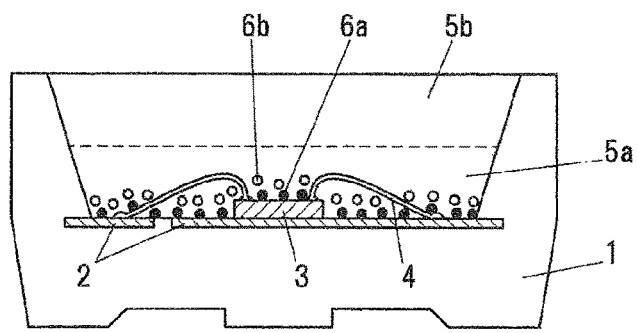

Next, as shown in FIG. 6D, the second sealing material 5b is heated to the viscosity reduction temperature to cause the second phosphor particles 6b to precipitate.

At this stage, since the first sealing material 5a is not cured in the same manner as the second sealing material 5b and maintains low viscosity, at least some of the second phosphor particles 6b precipitate on the layer of the first phosphor particles 6a in the first sealing material 5a.

After the second phosphor particles 6b precipitate, the first sealing material 5a and the second sealing material 5b are cured by further heating to the curing temperature.

Effects of the Embodiments

In the embodiments, it is possible to manufacture light-emitting devices with less unevenness in emission color by causing plural types of phosphor particles to precipitate of a sealing material at predetermined positions without causing uneven precipitation.

Although the embodiments of the invention have been described above, the invention is not intended to be limited to the embodiments and the various kinds of modifications can be implemented without departing from the gist of the invention.

For example, although the light-emitting devices in the embodiments are manufactured using two types of phosphor particles, not less than three types of phosphor particles may be used. Also in such a case, separate sealing materials including different types of phosphor particles are separately injected into a case, in the same manner as the embodiments.

In addition, the invention according to claims is not to be limited to the embodiments. Further, please note that all combinations of the features described in the embodiments are not necessary to solve the problem of the invention.

What is claimed is:

1. A method of manufacturing a light-emitting device, the method comprising:
    providing a case comprising a recessed portion and mounting a light-emitting element on a bottom of the recessed portion;
    putting a first sealing material comprising a first phosphor particle into the recessed portion;
    putting a second sealing material comprising a second phosphor particle on the first sealing material in the recessed portion;
    precipitating the second phosphor particle before curing the second sealing material; and
    curing the first sealing material and the second sealing material after the precipitating of the second phosphor particle,
    wherein the second phosphor particle is located above the first phosphor particle after the first and second sealing materials cure,
    wherein the precipitating of the second phosphor particle is conducted so as to form a layer of the second phosphor particle at a bottom of the second sealing material before the curing of the first sealing material and the second sealing material, and
    wherein the first phosphor particle and the second phosphor particle are different in a degree of precipitation.

2. The method according to claim 1, wherein the second phosphor particle is completely precipitated before the second sealing material cures.

3. The method according to claim 1, wherein the first sealing material comprises a dispersant that improves dispersibility of the first phosphor particle.

4. The method according to claim 1, wherein the first sealing material has a lower refractive index than a top layer of the light-emitting element, and
    wherein the second sealing material has a lower refractive index than the first sealing material.

5. The method according to claim 1, wherein the first phosphor particle has a longer fluorescence wavelength than the second phosphor particle.

6. The method according to claim 1, wherein the second sealing material has a lower refractive index than the first sealing material.

7. The method according to claim 1, wherein the precipitating the second phosphor particle comprises precipitating the second phosphor particle on an interface between the first sealing material and the second sealing material.

8. The method according to claim 1, further comprising:
    heating the first sealing material to cure the first sealing material.

9. The method according to claim 8, further comprising:
    after the second phosphor particle precipitates and an upper portion of the second sealing material becomes transparent, heating the second sealing material to cure the second sealing material.

10. The method according to claim 1, wherein said curing the first sealing material and the second sealing material is conducted such that opposing surfaces of the first sealing material and the second sealing material directly contact each other in an interface between the first sealing material and the second sealing material.

11. A method of manufacturing a light-emitting device, the method comprising:
    disposing a first sealing material comprising a first phosphor particle into a case that holds a light-emitting element;
    disposing a second sealing material comprising a second phosphor particle on the first sealing material in the case;
    precipitating the second phosphor particle before curing the second sealing material; and
    curing the first sealing material and the second sealing material after the precipitating of the second phosphor particle,
    wherein the second phosphor particle is located above the first phosphor particle after the first and second sealing materials cure,
    wherein the precipitating of the second phosphor particle is conducted so as to form a layer of the second phosphor particle at a bottom of the second sealing material before the curing of the first sealing material and the second sealing material, and
    wherein the first phosphor particle and the second phosphor particle are different in a degree of precipitation.

12. The method according to claim 11, wherein the second phosphor particle is completely precipitated before the second sealing material cures.

13. The method according to claim 11, wherein the first sealing material has a lower refractive index than a superficial layer of the light-emitting element.

14. The method according to claim 11, wherein the second sealing material has a lower refractive index than the first sealing material.

15. The method according to claim 11, wherein the precipitating the second phosphor particle comprises precipitating the second phosphor particle on an interface between the first sealing material and the second sealing material.

16. The method according to claim 11, further comprising:
    heating the first sealing material to cure the first sealing material.

17. The method according to claim 16, further comprising:
    after the second phosphor particle precipitates and an upper portion of the second sealing material becomes transparent, heating the second sealing material to cure the second sealing material.

18. The method according to claim 11, wherein the first phosphor particle has a longer fluorescence wavelength than the second phosphor particle.

* * * * *